(12) United States Patent
Goto et al.

(10) Patent No.: US 7,394,159 B2
(45) Date of Patent: Jul. 1, 2008

(54) DELAMINATION REDUCTION BETWEEN VIAS AND CONDUCTIVE PADS

(75) Inventors: Hideki Goto, Ibaraki (JP); Toshimi Kohmura, Ibaragi pref. (JP)

(73) Assignee: Intel Corporation, Santa Clara, CA (US)

( * ) Notice: Subject to any disclaimer, the term of this patent is extended or adjusted under 35 U.S.C. 154(b) by 276 days.

(21) Appl. No.: 11/066,705

(22) Filed: Feb. 23, 2005

(65) Prior Publication Data

US 2006/0186537 A1 Aug. 24, 2006

(51) Int. Cl.
*H01L 23/48* (2006.01)
*H01L 23/52* (2006.01)

(52) U.S. Cl. .................. 257/773; 257/786; 257/774; 257/737; 257/E23.02

(58) Field of Classification Search ............ 257/773, 257/774, 786, 787, 737, E23.02
See application file for complete search history.

(56) References Cited

U.S. PATENT DOCUMENTS

| | | | | | |
|---|---|---|---|---|---|
| 5,248,903 | A | * | 9/1993 | Heim | 257/748 |
| 5,736,791 | A | * | 4/1998 | Fujiki et al. | 257/781 |
| 6,020,647 | A | * | 2/2000 | Skala et al. | 257/784 |
| 6,313,541 | B1 | * | 11/2001 | Chan et al. | 257/786 |
| 6,534,723 | B1 | * | 3/2003 | Asai et al. | 174/255 |
| 6,982,487 | B2 | * | 1/2006 | Kim et al. | 257/774 |
| 2004/0004284 | A1 | * | 1/2004 | Lee et al. | 257/737 |

FOREIGN PATENT DOCUMENTS

JP 11-297873 * 10/1999 .................. 23/12

* cited by examiner

*Primary Examiner*—Nitin Parekh
(74) *Attorney, Agent, or Firm*—Schwabe, Williamson & Wyatt, P.C.

(57) ABSTRACT

Vias and conductive pads configured and coupled in a manner to reduce delamination are described herein. The via and the conductive pads may be located in a substrate such as a carrier substrate, a die, or a printed circuit board.

10 Claims, 5 Drawing Sheets

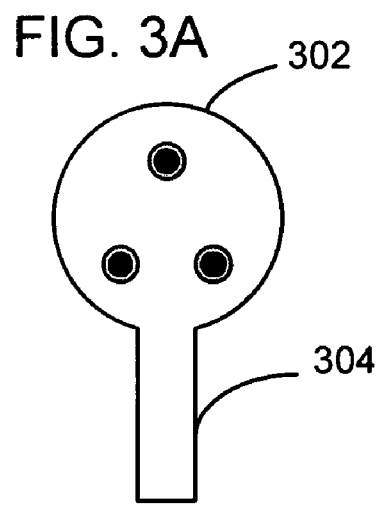
Multiple pinholes
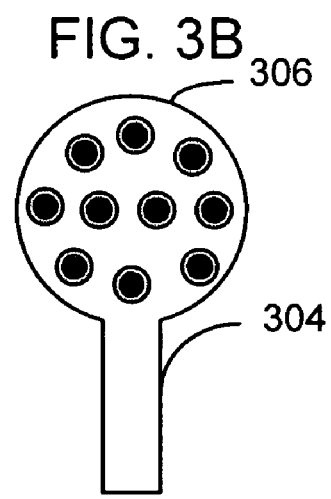
Mesh
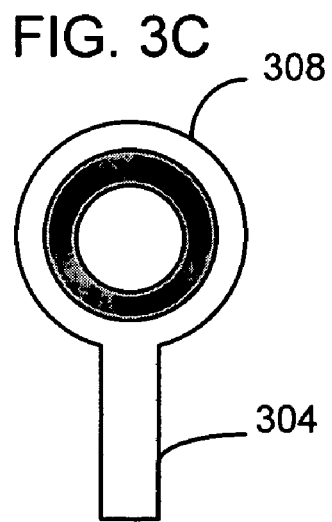
Doughnut shape
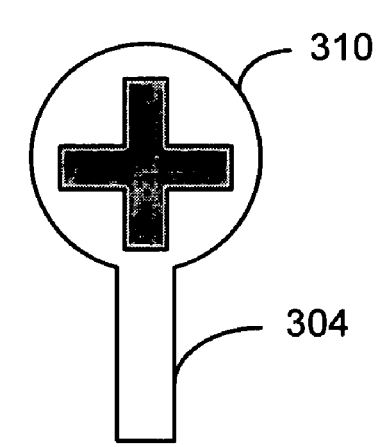
Cross shape

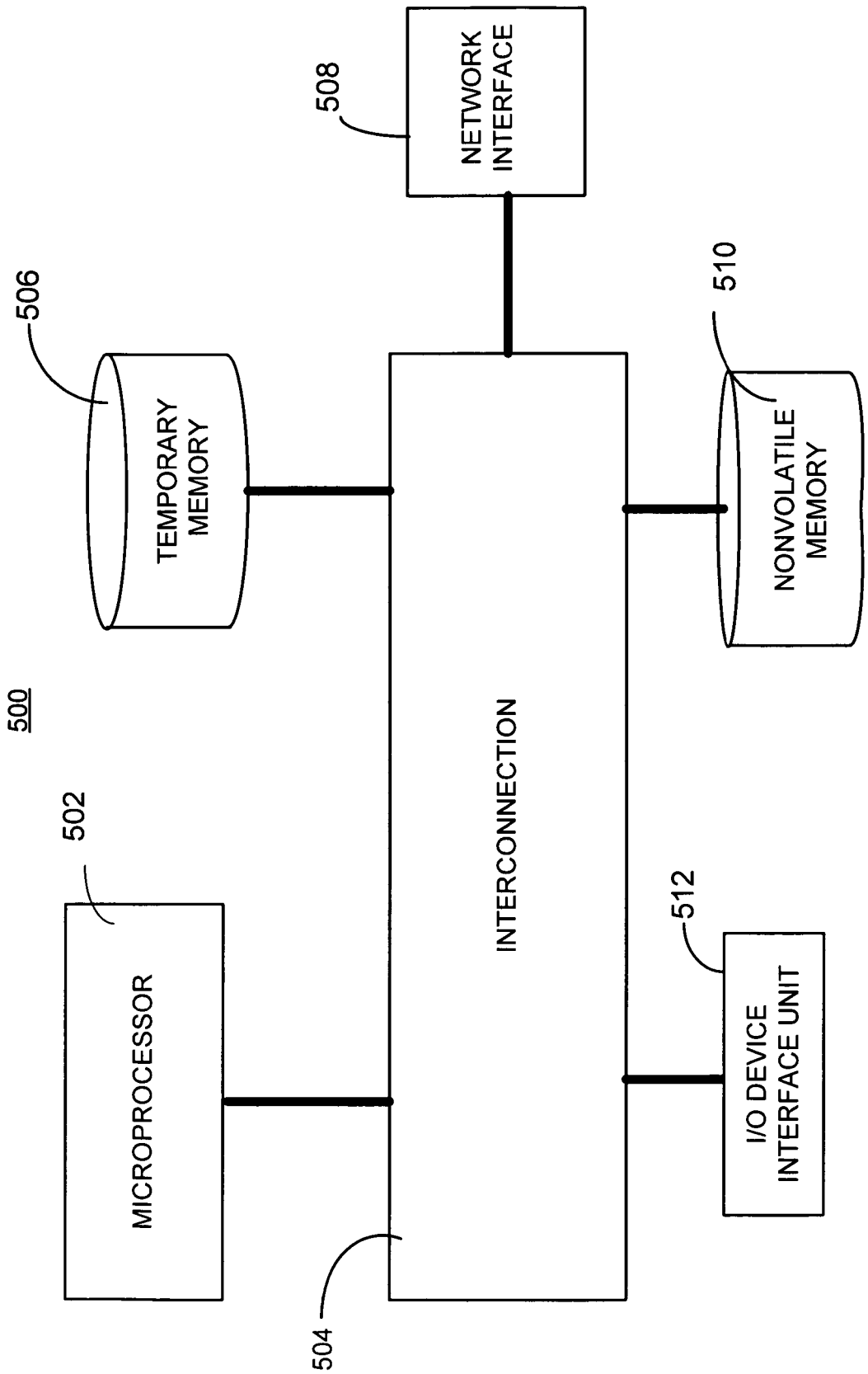

DELAMINATION REDUCTION BETWEEN VIAS AND CONDUCTIVE PADS

BACKGROUND OF THE INVENTION

Field of the Invention

Embodiments of the present invention relate to, but are not limited to, electronic devices and, in particular, to the field of conductive interconnects in electronic devices.

The current trend in electronics is to make electronic devices with smaller components. These components include electronic packages such as microprocessor and memory packages. The electronic packages typically include a die that is usually mounted onto a supporting substrate sometimes referred to as a carrier or package (herein "carrier") substrate. The electronic package, in turn, is typically mounted onto a printed circuit board (PCB). The die, the carrier substrate and the PCB may each contain one or more substrate layers containing numerous conductive interconnects such as vias and traces. Vias are conductive interconnects that run between two or more substrate layers while traces are conductive interconnects that run within a single substrate layer. The vias are often coupled to the traces by coupling the vias with conductive pads such as via capture pads that may be part of or are coupled to traces. In order to main good electrical contact between the vias and the via conductive pads, generally there should be good physical contact between the vias and the via conductive pads.

FIG. 1A depicts a conventional via and conductive pad in a carrier substrate. In this illustration, the conductive pad 102 is on top of a first dielectric layer 103. The via 104 is located above the conductive pad 102 and is coupled to a first trace 106. Surrounding the via 104 is a second dielectric layer 108. In this illustration, the width 105 of the bottom portion of the via 104 is smaller than the width 107 of the conductive pad 102 as depicted in FIG. 1B, which is a top down view of the conductive pad 102 of FIG. 1A with the outline of the via 104 (note that in FIG. 1B, the conductive pad 102 is coupled to or is part of a second trace 109, which is not depicted in FIG. 1A).

One problem currently being encountered is the occurrence of delamination between vias and traces as depicted by ref. 112 in FIG. 1A. The occurrence of delamination is undesirable because it can cause electrical opens or high resistance failures. In other words, electrical conductivity between vias and via conductive pads may occur when delamination occurs. A contributing factor for delamination is the differences in the coefficient of thermal expansion (CTE) associated with the various components that make up, for example, a carrier substrate. For instance, the dielectrics that surround the vias and traces that are embedded in the carrier substrate will typically have CTE values that are different from those of the vias and traces. The differences in the CTE will often result in significant mechanical stress during temperature variations. As a result, delamination or separation of the vias from the contact pads or traces may occur, which may be detrimental to the performance of the entire electronic package. This may be a particularly significant problem as the sizes of vias and traces continually shrink.

BRIEF DESCRIPTION OF DRAWINGS

The present invention will be described by way of exemplary embodiments, but not limitations, illustrated in the accompanying drawings in which like references denote similar elements, and in which:

FIGS. 3A to 3D illustrate various conductive pad anchor structures in accordance with some embodiments;

FIG. 5 is a block diagram of an example system in accordance with some embodiments.

DETAILED DESCRIPTION OF ILLUSTRATIVE EMBODIMENTS

Figure 1A:
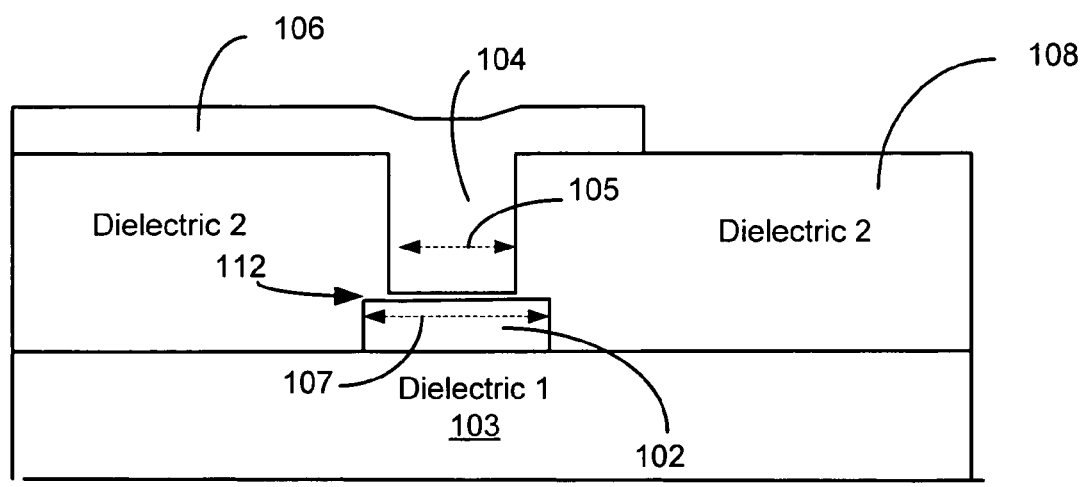
FIG. 1A illustrates a prior art via/conductive pad coupling in a substrate.

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention.

The following description includes terms such as on, onto, on top, underneath, underlying, downward, lateral, and the like, that are used for descriptive purposes only and are not to be construed as limiting. That is, these terms are terms that are relative only to a point of reference and are not meant to be interpreted as limitations but are instead included in the following description to facilitate understanding of the various aspects of the invention.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation. In addition, one or more of the operations may be eliminated while other operations may be added in different embodiments of the invention.

According to various embodiments of the invention, conductive interconnect components such as vias and conductive pads may be configured and/or coupled in a manner to reduce delamination between the vias and the conductive pads. The occurrence of delamination between vias and conductive pads may result in poor electrical conductivity between the vias and the conductive pads and may result in poor overall device performance. For the embodiments, the vias and the conductive pads may be incorporated into a substrate such as a carrier substrate, a printed circuit board (PCB), a die or other electronic substrates. The conductive pads may be via capture pads that may be part of or coupled to conductive traces. In some instances, the conductive pads may be disposed on top of an underlying layer such as a dielectric layer or an organic core and may include a first surface that is parallel to the surface of the underlying layer. The conductive pads may further include one or more second surfaces that intersect the first surface. In some embodiments, the one or more second surfaces may be orthogonal to the first surface while in other embodiments, the one or more second surfaces may be disposed at less than or greater than 90 degree angles from the first surface. The substrate may be made of a plurality of substrate layers in addition to an organic core. The substrate may further include other components such as resistors, capacitors, diodes, and/or other electronic components. In order to reduce delamination or to maintain satisfactory electrical conductivity between vias and conductive pads during, for example, temperature cycling, the vias may be in contact with the first surfaces and at least portions of the one or more second surfaces that intersects the first surfaces of the conductive pads.

Figure 2:
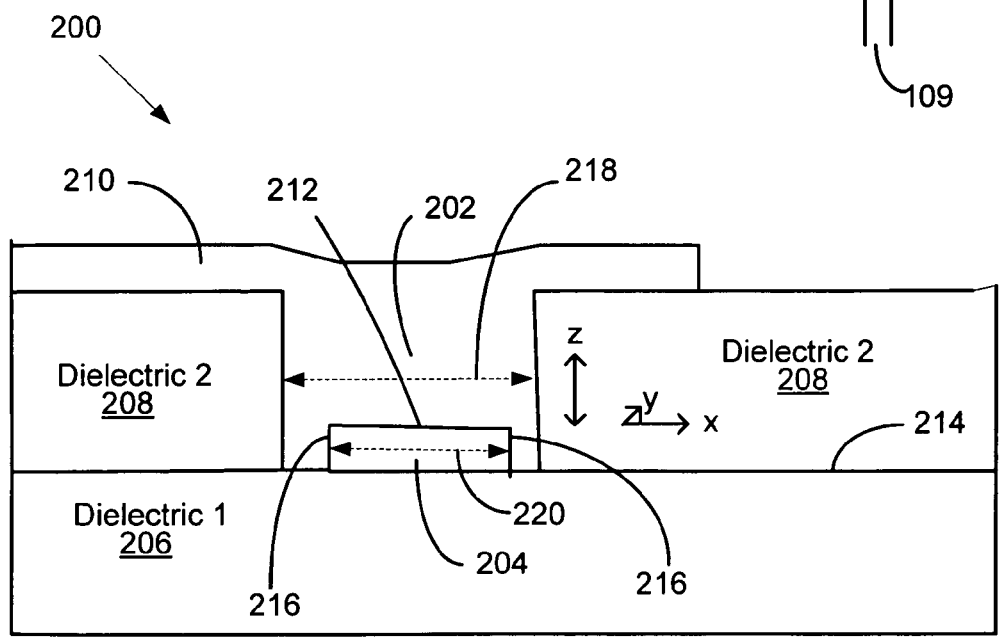
FIG. 2 illustrates a via/conductive pad coupling with reduced delamination in accordance with some embodiments.

FIG. 2 depicts a via/conductive pad coupling configured and coupled in a manner that reduces delamination and maintain satisfactory or good electrical contact between the via and the conductive pad in accordance with some embodiments of the invention. The substrate 200 may be a carrier or package substrate, a die, a PCB or other electronic substrates. In the case where the substrate 200 is a carrier substrate, the substrate 200 may include an organic core with one or more dielectric layers on or covering the core. Further, in the case where the substrate 200 is a carrier substrate, the substrate 200 may be configured as a pin grid array (PGA), a ball grid array (BGA), a land grid array (LGA), or other types of carrier substrate.

The conductive pad 204 may be disposed on top of a first dielectric layer 206. The first dielectric layer 206, in some embodiments, may be made of epoxy based dielectric material, while in other embodiments, the first dielectric layer 206 may be made of other dielectric material. Coupled to the conductive pad 204 is a via 202. Surrounding the via 202 is a second dielectric layer 208, which may be made of epoxy based dielectric or some other dielectric material. The via 202 may be further coupled to a trace 210, which may be on the second dielectric layer 208.

The conductive pad 204 may have a first surface 212 that is substantially parallel to the surface 214 of the first dielectric layer 206. The conductive pad 204 may further include a second surface 216 that intersects the first surface 212 and the surface 214 of the first dielectric layer 206. In this illustration, the first surface 212 is located along the xy or horizontal plane and the second surface 216 is located along the z or vertical plane and may encircle the conductive pad 204. As a result, and shown in FIG. 2, in these embodiments, the second surface 216 is entirely orthogonal to the first surface 212 between the first surface 212 and the surface 214 of the first dielectric layer 206. In other embodiments, however, the second surface 216 may not be entirely orthogonal to the first surface 212 and may instead, be angularly positioned relative to the first surface 212 such as in a less than or a greater than 90 degree angle from the first surface 212. In these embodiments, the conductive pad 204 may have a circular or a solid cylindrical shape. However, in other embodiments, the conductive pad 204 may not have a purely round or solid cylindrical shape but instead may have other shape types that may include a plurality of second surfaces that intersect the first surface 212 (see FIGS. 3A to 3D). These second surfaces may also be entirely orthogonal (e.g., 90 degree oriented) to the first surface 212 or may not be orthogonal to the first surface 212 (e.g., greater than or less than 90 degrees relative to the first surface 212).

The via 202 may be an interlayer interconnect that electrically couples one or more components from one substrate layer to one or more components in another substrate layer. In this illustration, the via 202 electrically couples the trace 210 to the conductive pad 204, which may be part of or is coupled to a second trace (not shown). At least the bottom portion of the via 202 may have a first width 218 that is greater than a second width 220 of the conductive pad 204. The via 202 may have at least two bottom surfaces. A first via bottom surface that may be parallel to and in contact with the first surface 212 of the conductive pad 204. The via 202 may further include a second via bottom surface that may intersect the first via bottom surface and may be at least partially in contact with the second surface 216 of the conductive pad 204. This may assure that at least portions of the via 202 retains good electrical contact with at least portions of the second surface 216 of the conductive pad 204 even when vertical or z-directional stress is applied to either the via 202 and/or conductive pad 204 as a result of thermal cycling. The via 202, the conductive pad 204 and traces (i.e., trace 210 and the trace that may be associated with the conductive pad 204) may be made of conductive materials such as copper (Cu) or other conductive materials.

By contacting the via 202 with at least a portion of the second surface 216 of the conductive pad 204, delamination between the via 202 and the conductive pad 204 may be reduced or even eliminated. That is, as described previously, during temperature fluctuations, mechanical stress caused by differences in the CTE of various substrate components (e.g., the second dielectric layer 208 and the via 202) will typically occur in the vertical or z-direction. If only the xy or horizontal plane surfaces of the via 104 and the conductive pad 102 are in contact as depicted in FIG. 1, delamination will likely occur which may result in poor conductive contact between the via 104 and the conductive pad 102. By increasing the contact surface areas such as by contacting the via 202 (as depicted in FIG. 2)with, for example, the vertical (z-direction) surface or surfaces (e.g., second surface 216) of the conductive pad 204, delamination may be reduced or completely eliminated. The actual dimensions of the via 202 and the conductive pad 204 may vary significantly depending upon the circumstances in which the via 202 and the conductive pad 204 are being employed and the configuration of the conductive pad 204. For example, when the conductive pad 204 has a solid cylindrical shape such as depicted in FIG. 2, the width of the bottom of the via 202 may be greater than the width of the conductive pad 204. However, when the conductive pad 204 has an anchor structure (see FIGS. 3A to 3D), the width of the bottom of the via 202 may be smaller or larger than the width of the conductive pad 204.

Although the conductive pad 204 described above was described as having a solid round or a solid cylindrical shape, in other embodiments, a conductive pad may take on other shapes that increases the contact surface area between a via and the conductive pad. For these embodiments, the additional contact surface area or areas may be as a result of having one or more additional second surfaces (that intersect the first surface of the conductive pad) on the conductive pad and contacting at least portions of these one or more additional second surfaces with the via. For example, FIGS. 3A to 3D depict top down views of four conductive pads having double-anchoring (herein "anchoring") structures that have additional second surfaces (that intersect the first surfaces of the contact pads). In particular, FIG. 3A is a conductive pad 302 with multiple pinholes. As illustrated, the conductive pad 302 is coupled to a trace 304. FIG. 3B depicts a conductive pad 306 with a mesh structure. FIG. 3C is a conductive pad 308 with a doughnut structure. FIG. 3D is a conductive pad 310 with cross structure. Each of the structures depicted has an external circular vertical or z surface. Each of the structures may further include one or more additional second surfaces that may at least partially couple with a via that may be disposed on top of the structures. These additional second surfaces will intersect (either entirely orthogonally or at greater than or less than 90 degree angles) with the first surfaces of the conductive pads.

Figure 4A:
FIGS. 4A to 4K illustrate various stages for forming a via and a conductive pad with reduced delamination in accordance with some embodiments.

FIGS. 4A to 4K depicts various stages for forming a via/conductive pad coupling with reduced delamination such as those described above in accordance with some embodiments of the invention. Note that although FIGS. 4A to 4K depict discrete operations, as previously mentioned, those of ordinary skill in the art will recognize that many variations for obtaining similar results are possible. Thus, FIGS. 4A to 4K illustrate only one example approach for forming the via/conductive pad coupling described above. The formation of the via and conductive pad may begin when a substrate including a first dielectric layer 402 is provided. An electroless metal plating operation may be performed on the substrate to form a copper (Cu) layer 404 on top of the first dielectric layer 402 as depicted in FIG. 4A. In various embodiments, the first dielectric layer 402 may be made of epoxy based dielectric material or some other dielectric material. Note that in other embodiments, the copper layer 404 may be replaced with a layer of another conductive material.

Figure 4B:
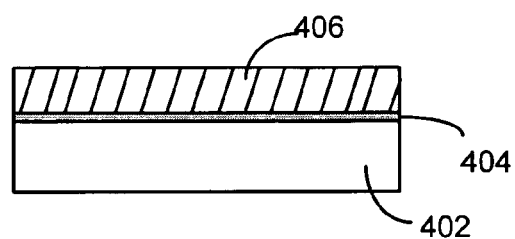
Figure 4C:
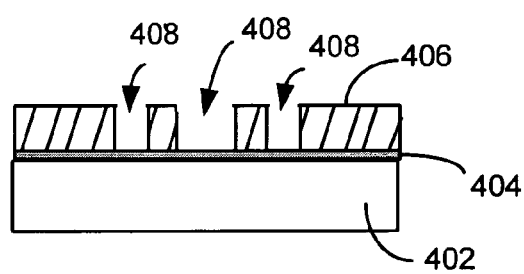
Figure 4D:
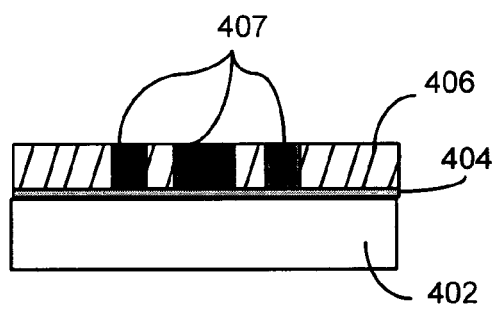

A resist film 406 such as a dry resist film, may be laminated on to the Cu layer 402 as depicted in FIG. 4B. A mask containing apertures (not depicted) may then be placed over the resist film 406 and the mask as well as the exposed portions of the resist film 406 are exposed to electromagnetic radiation such as ultraviolet (UV) radiation. The exposed portions of the resist film may be developed and removed forming a pattern 408 that may be eventually used to form the conductive pad as depicted in FIG. 4C. Following the formation of the patterned resist film 406, a conductive material 407 such as Cu or other conductive material may be deposited into the pattern 408 using, for example, electrolytic plating as depicted in FIG. 4D.

Figure 1B:
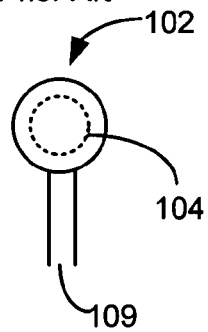
FIG. 1B illustrates a top down view of the conductive pad of FIG. 1A.
Figure 4E:
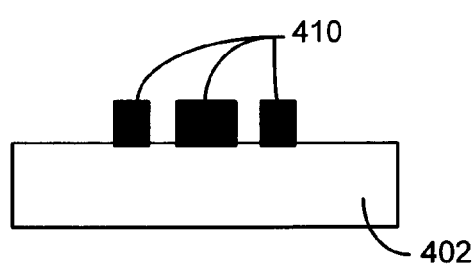
Figure 4F:
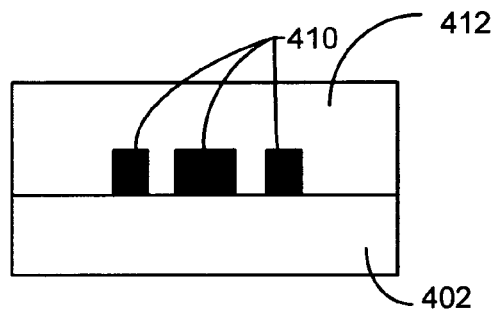
Figure 4G:
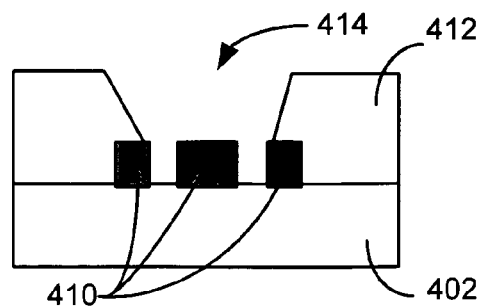

Following the deposition of the Cu into the pattern 408, the resist film 406 may be removed to form the conductive pad 410 as depicted in FIG. 4E. Further, in order to form isolated conductive pattern (as depicted in FIG. 4F), copper layer 404 may be removed or etched out as also depicted in FIG. 4E. For the embodiments, the conductive pad 410 may be a via capture pad having an anchor structure. In other embodiments, however, the conductive pad may have the solid cylindrical structure as depicted in FIGS. 1A and 1B. A second dielectric layer 412 may be formed or laminated on top of the conductive pad 410 as depicted in FIG. 4F. The second dielectric layer 412, in some instances, may be a layer of epoxy based dielectric or some other dielectric material such as photo imageable dielectric. Next, an aperture 414 is formed on the second dielectric layer 412 using, for example, laser drilling as depicted in FIG. 4G. Alternatively, if the second dielectric layer 412 is made of photo imageable dielectric then the aperture 414 may be formed using a mask and exposure process. Once the aperture 414 has been formed, a Desmear operation may be performed. In various embodiments, the Desmear operation may be performed to remove residue from the surface of the conductive pad 410 and also to make the surface on the second dielectric layer 412 rougher or coarser for better mechanical adhesion between the second dielectric layer 412 and a conductive layer 416 that may be deposited onto the dielectric layer 412 in subsequent operation (see FIG. 4H).

Figure 4H:
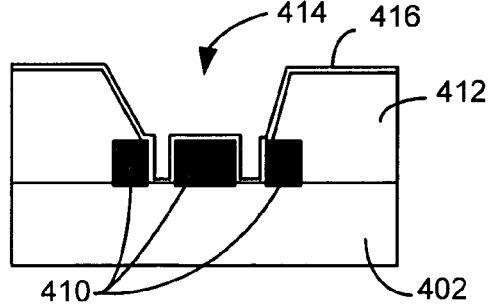
Figure 4I:
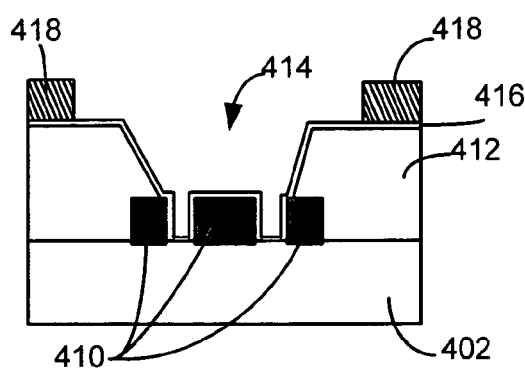
Figure 4J:
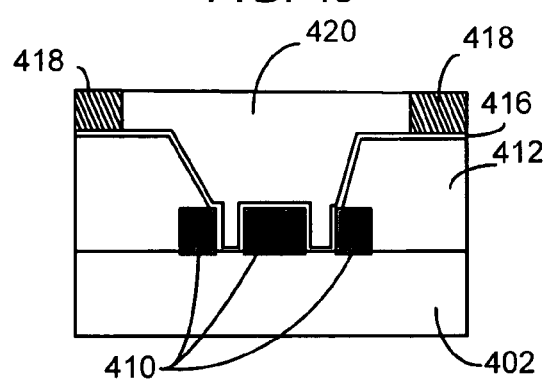

A layer of conductive layer 416 such as Cu may be formed on top of the second dielectric layer 412 and within the aperture 414 using, for example, an electroless plating operation as depicted in FIG. 4H. Next, a resist film 418 may be formed on portions of the conductive layer 416 that is on top of the second dielectric layer 412 but not within the aperture 414 as depicted in FIG. 4I. The resist film 418, in some embodiments, may be a dry film resist that is laminated onto the conductive layer 416. Once the resist film 418 has been formed, a conductive material such as copper may be deposited into the aperture 414 forming a via 420 as depicted in FIG. 4J. The deposition of the conductive material, in some embodiments, may be accomplished by electrolytic plating. After the deposition of the conductive material and the formation of the via 420, the resist film 418 as well as the exposed portions of the conductive layer 416 that is on top of the second dielectric layer 412 (but not underneath the via 420) may be removed as depicted in FIG. 4K.

Figure 4K:
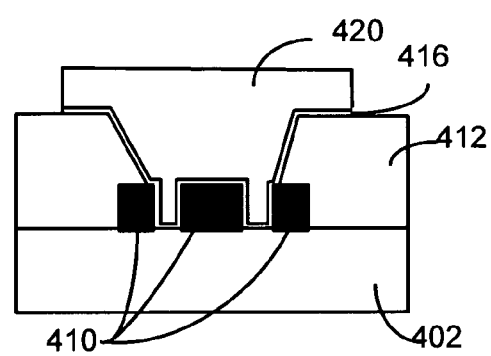

The via 420, as depicted in FIG. 4K, will be in contact with both the xy or horizontal surface of the conductive pad 410 and the z or vertical surfaces of the conductive pad 410 through the remaining conductive layer 416 that is disposed between the via 420 and the conductive pad 410. The contact of the via 420 with the vertical surfaces of the conductive pad 410 may result in reduced or elimination of delamination.

Referring now to FIG. 5, where a system 500 in accordance with some embodiments is shown. The system 500 includes a microprocessor 502 that may be coupled to an interconnection 504, which may include one or more chips. The system 500 may further include temporary memory 506, a network interface 508, an optional nonvolatile memory 510 (such as a mass storage device) and an input/output (I/O) device interface unit 512. In some embodiments, the input/output device interface unit 512 may be adapted to interface a keyboard, a cursor control device, and/or other devices. One or more of the above-enumerated elements, such as microprocessor 502, may include the via/conductive pad couplings described above.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the embodiments of the present invention. Therefore, it is manifestly intended that this invention be limited only by the claims.

What is claimed is:

1. A substrate, comprising:
a first dielectric layer including a dielectric surface;
a conductive pad on the dielectric surface of the first dielectric layer, the conductive pad having an anchor structure and a first, a second, and a third surface, the first surface being a planar surface and parallel with the dielectric surface of the first dielectric layer, the second and third surfaces intersecting the first surface of the conductive pad and the dielectric surface of the first dielectric layer and being entirely orthogonal to the first surface of the conductive pad between the first surface of the conductive pad and the dielectric surface of the first dielectric layer;
a second dielectric layer disposed at least on a portion of the dielectric surface of the first dielectric layer, the second dielectric layer having a first surface, a second surface opposite of the first surface, and a third surface intersecting the first and second surfaces of the second dielectric layer and defining, at least in part, a via hole within where the conductive pad is disposed on the dielectric surface, the second surface of the second dielectric layer being disposed at least on the portion of the dielectric surface of the first dielectric layer, the second dielectric layer having a height that is greater than a height of the conductive pad, the height of the conductive pad being the distance between the first surface of the conductive pad and the dielectric surface of the first dielectric layer, the height of the second dielectric layer being the distance between the first and the second surface of the second dielectric layer; and a via filling the via hole and extending from the first surface of the conductive pad down to portions of the dielectric surface of the first dielectric layer not covered by the conductive pad, the via being in contact with the first surface of the conductive pad, an entire length of the second surface of the conductive pad from the first surface of the conductive pad to dielectric surface of the dielectric layer, and an entire length of the third surface of the conductive pad from the first surface of the conductive pad to the dielectric surface of the dielectric layer wherein the second and the third surfaces of the conductive pad are configured such that the second surface entirely surrounds the third surface.

2. The substrate of claim 1, wherein the via is in contact with at least a portion of the second surface of the conductive pad in a manner to reduce delamination between the via and the conductive pad.

3. The substrate of claim 1, wherein the conductive pad having a first width and the via having a second width that is greater than the first width.

4. The substrate of claim 1, wherein the conductive pad is part of a conductive trace.

5. The substrate of claim 1, wherein the via is in contact with at least the portion of the third surface of the conductive pad in a manner to reduce delamination between the via and the conductive pad.

6. The substrate of claim 1, wherein the conductive pad has an anchor structure having a shape selected from the group consisting of doughnut, multiple pinholes, mesh, and cross shapes.

7. The substrate of claim 1, wherein the conductive pad having a circular shape.

8. The substrate of claim 1, wherein the substrate is a substrate selected from the group consisting of a die, a carrier substrate and a printed circuit board (PCB).

9. The substrate of claim 1, wherein the second surface and the third surface of the conductive pad have substantially a same height between the first surface of the conductive pad and the dielectric surface of the first dielectric layer.

10. The substrate of claim 1, wherein the first dielectric layer consisting of a single dielectric layer.

* * * * *

UNITED STATES PATENT AND TRADEMARK OFFICE
CERTIFICATE OF CORRECTION

PATENT NO. : 7,394,159 B2 Page 1 of 1
APPLICATION NO. : 11/066705
DATED : July 1, 2008
INVENTOR(S) : Goto et al.

It is certified that error appears in the above-identified patent and that said Letters Patent is hereby corrected as shown below:

Column 7
Line 9, "...to dielectric surface..." should read --...to the dielectric surface...--.

Signed and Sealed this

Twentieth Day of October, 2009

David J. Kappos
*Director of the United States Patent and Trademark Office*